(12) United States Patent
Terasaki et al.

(10) Patent No.: US 10,410,951 B2
(45) Date of Patent: Sep. 10, 2019

(54) BONDED BODY, SUBSTRATE FOR POWER MODULE WITH HEAT SINK, HEAT SINK, METHOD FOR PRODUCING BONDED BODY, METHOD FOR PRODUCING SUBSTRATE FOR POWER MODULE WITH HEAT SINK, AND METHOD FOR PRODUCING HEAT SINK

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 24 days.

(21) Appl. No.: 15/786,820

(22) Filed: Oct. 18, 2017

(65) Prior Publication Data

US 2018/0040535 A1 Feb. 8, 2018

Related U.S. Application Data

(62) Division of application No. 15/566,385, filed as application No. PCT/JP2016/061686 on Apr. 11, 2016.

(30) Foreign Application Priority Data

Apr. 16, 2015 (JP) .................. 2015-084030
Feb. 24, 2016 (JP) .................. 2016-033202

(51) Int. Cl.
*H01L 23/40* (2006.01)
*H05K 7/20* (2006.01)
(Continued)

(52) U.S. Cl.
CPC .......... *H01L 23/3735* (2013.01); *B23K 20/02* (2013.01); *B23K 20/26* (2013.01);
(Continued)

(58) Field of Classification Search
CPC ....... H01L 23/40; H01L 23/142; H01L 23/13; H01L 23/3737; H05K 7/20; B23K 20/26
See application file for complete search history.

(56) References Cited

U.S. PATENT DOCUMENTS 4,838,474 A 6/1989 Ohashi et al.
4,890,784 A 1/1990 Bampton
(Continued)

FOREIGN PATENT DOCUMENTS

EP 2530707 A2 12/2012
JP 63-220987 A 9/1988
(Continued)

OTHER PUBLICATIONS

Search Report dated Nov. 28, 2018, issued for the European patent application No. 16780008.5.
(Continued)

*Primary Examiner* — Seahvosh Nikmanesh
(74) *Attorney, Agent, or Firm* — Locke Lord LLP; James E. Armstrong, IV; Nicholas J. DiCeglie, Jr.

(57) ABSTRACT

A bonded body is provided in which an aluminum alloy member formed from an aluminum alloy, and a metal member formed from copper, nickel, or silver are bonded to each other. The aluminum alloy member is constituted by an aluminum alloy in which a concentration of Si is in a range of 1 mass % to 25 mass %. The aluminum alloy member and the metal member are subjected to solid-phase diffusion bonding. A compound layer, which is formed through diffusion of Al of the aluminum alloy member and a metal element of the metal member, is provided at a bonding
(Continued)

interface between the aluminum alloy member and the metal member. A Mg-concentrated layer, in which a concentration of Mg is to 3 mass % or greater, is formed at the inside of the compound layer, and the thickness of the Mg-concentrated layer is in a range of 1 µm to 30 µm.

6 Claims, 8 Drawing Sheets

(51) Int. Cl.
| | |
|---|---|
| H01L 23/373 | (2006.01) |
| B23K 20/26 | (2006.01) |
| H05K 1/18 | (2006.01) |
| H05K 1/02 | (2006.01) |
| H01L 23/13 | (2006.01) |
| H01L 23/14 | (2006.01) |
| B23K 20/02 | (2006.01) |
| H01L 21/48 | (2006.01) |
| H01L 23/367 | (2006.01) |
| H01L 23/498 | (2006.01) |
| H01L 23/473 | (2006.01) |
| C04B 37/00 | (2006.01) |
| C04B 35/645 | (2006.01) |
| C04B 37/02 | (2006.01) |
| H01L 23/00 | (2006.01) |
| B23K 103/10 | (2006.01) |
| B23K 103/12 | (2006.01) |
| B23K 103/18 | (2006.01) |

(52) U.S. Cl.
CPC ............ *C04B 35/645* (2013.01); *C04B 37/00* (2013.01); *C04B 37/026* (2013.01); *H01L 21/4846* (2013.01); *H01L 21/4882* (2013.01); *H01L 23/13* (2013.01); *H01L 23/142* (2013.01); *H01L 23/367* (2013.01); *H01L 23/3737* (2013.01); *H01L 23/40* (2013.01); *H01L 23/473* (2013.01); *H01L 23/49838* (2013.01); *H05K 1/0203* (2013.01); *H05K 1/0204* (2013.01); *H05K 1/181* (2013.01); *H05K 7/20* (2013.01); *B23K 2103/10* (2018.08); *B23K 2103/12* (2018.08); *B23K 2103/18* (2018.08); *B23K 2103/26* (2018.08); *C04B 2235/6581* (2013.01); *C04B 2237/121* (2013.01); *C04B 2237/128* (2013.01); *C04B 2237/343* (2013.01); *C04B 2237/366* (2013.01); *C04B 2237/368* (2013.01); *C04B 2237/402* (2013.01); *C04B 2237/704* (2013.01); *C04B 2237/706* (2013.01); *C04B 2237/708* (2013.01); *H01L 24/32* (2013.01); *H01L 24/83* (2013.01); *H01L 2224/32225* (2013.01); *H05K 1/0272* (2013.01)

(56) References Cited

U.S. PATENT DOCUMENTS

| | | | |
|---|---|---|---|
| 9,266,188 | B2 | 2/2016 | Oda et al. |
| 9,723,707 | B2 | 8/2017 | Terasaki et al. |
| 2012/0305281 | A1 | 12/2012 | Knoll |
| 2016/0035660 | A1 | 2/2016 | Terasaki et al. |

FOREIGN PATENT DOCUMENTS

| | | |
|---|---|---|
| JP | 04-288983 A | 10/1992 |
| JP | 3171234 B2 | 5/2001 |
| JP | 2002-064169 A | 2/2002 |
| JP | 2004-172378 A | 6/2004 |
| JP | 2008-208442 A | 9/2008 |
| JP | 2010-094683 A | 4/2010 |
| JP | 2014-060215 A | 4/2014 |
| JP | 2014-099596 A | 5/2014 |
| JP | 2014-160799 A | 9/2014 |

OTHER PUBLICATIONS

Office Action dated Jun. 28, 2018, issued for U.S. Appl. No. 15/566,385.
Office Action dated Mar. 8, 2018, issued for the U.S. Appl. No. 15/566,385.
International Search Report dated Jun. 28, 2016, issued for PCT/JP2016/061686 and English translation thereof.

BONDED BODY, SUBSTRATE FOR POWER MODULE WITH HEAT SINK, HEAT SINK, METHOD FOR PRODUCING BONDED BODY, METHOD FOR PRODUCING SUBSTRATE FOR POWER MODULE WITH HEAT SINK, AND METHOD FOR PRODUCING HEAT SINK

This Application is a Division of application Ser. No. 15/566,385 filed on Oct. 13, 2017. Application PCT/JP2016/061686 claims priority for Application 2016-033202 filed on Feb. 24, 2016 in Japan. Application PCT/JP2016/061686 claims priority for Application 2015-084030 filed on Apr. 16, 2015 in Japan. The entire contents of these applications are incorporated herein by reference in their entirety.

TECHNICAL FIELD

The present invention relates to a bonded body that is formed by bonding an aluminum alloy member to a metal member formed from copper, nickel, or silver, a power module substrate with heat sink in which a heat sink is bonded to a power module substrate of which a circuit layer is formed on one surface of an insulating layer, a heat sink in which a metal member layer is formed in a heat sink main body, a method of manufacturing a bonded body, a method of manufacturing a power module substrate with heat sink, and a method of manufacturing a heat sink.

Priority is claimed on Japanese Patent Application No. 2015-084030, filed on Apr. 16, 2015, and Japanese Patent Application No. 2016-033202, filed on Feb. 24, 2016, the contents of which are incorporated herein by reference.

BACKGROUND ART

A semiconductor device such as an LED and a power module is provided with a structure in which a semiconductor element is bonded onto a circuit layer formed from a conductive material.

In a large-power control power semiconductor element that is used to control wind power generation, an electric vehicle, a hybrid car, and the like, the amount of heat generation is great. According to this, as a substrate on which the large-power control power semiconductor element is mounted, for example, a power module substrate including a ceramic substrate formed from aluminum nitride (AlN), alumina ($Al_2O_3$), and the like, and a circuit layer formed by bonding a metal plate with excellent conductivity on one surface of the ceramic substrate has been widely used in the related art. Furthermore, as the power module substrate, a power module substrate, in which a metal layer is formed on the other surface of the ceramic substrate, is also provided.

For example, a power module disclosed in PTL 1 has a structure including a power module substrate in which a circuit layer and a metal layer which are formed from Al are respectively formed on one surface and the other surface of a ceramic substrate, and a semiconductor element that is bonded onto the circuit layer through a solder material.

In addition, a heat sink is bonded to a metal layer side of the power module substrate to radiate heat, which is transferred from the semiconductor element to the power module substrate side, to an outer side through the heat sink.

However, as is the case with the power module described in PTL 1, in a case where the circuit layer and the metal layer are constituted by Al, an oxide film of Al is formed on a surface, and thus it is difficult to bond the semiconductor element or the heat sink onto the surface with the solder material.

Accordingly, in the related art, for example, as disclosed in PTL 2, after a Ni plating film is formed on the surface of the circuit layer and the metal layer through electroless plating and the like, the semiconductor element or the heat sink is subjected to solder-bonding.

In addition, PTL 3 suggests a technology of bonding the circuit layer and the semiconductor element, and the metal layer and the heat sink, respectively, by using silver oxide paste containing a reducing agent including silver oxide particles and an organic material as an alternative of the solder material.

However, as described in PTL 2, in the power module substrate in which the Ni plating film is formed on the surface of the circuit layer and the metal layer, during bonding of the semiconductor element and the heat sink, a surface of the Ni plating film deteriorates due to oxidation and the like, and thus there is a concern that bonding reliability of the semiconductor element and the heat sink which are bonded through the solder material deteriorates. Here, when bonding between the heat sink and the metal layer is not sufficient, there is a concern that heat resistance increases, and thus heat dissipation characteristics deteriorate. In addition, in a Ni plating process, a masking process may be performed in order to prevent problems such as electrolytic corrosion due to formation of the Ni plating in an unnecessary region from occurring. As described above, in a case of performing a plating process after performing the masking process, a great deal of labor is necessary in the process of forming the Ni plating film on the surface of the circuit layer and the surface of the metal layer, and thus there is a problem in that the manufacturing cost of the power module greatly increases.

In addition, as described in PTL 3, in a case of respectively bonding the circuit layer and the semiconductor element, and the metal layer and the heat sink by using the silver oxide paste, bondability between Al and a baked body of the silver oxide paste is poor, and thus it is necessary to form a Ag underlying layer on the surface of the circuit layer and the surface of the metal layer in advance. In a case of forming the Ag underlying layer through plating, there is a problem in that a great deal of labor is necessary similar to Ni plating.

Accordingly, PTL 4 suggests a power module substrate in which the circuit layer and the metal layer are set to have a laminated structure of an Al layer and a Cu layer. In the power module substrate, the Cu layer is disposed on the surface of the circuit layer and the metal layer, and thus it is possible to bond the semiconductor element and the heat sink by using a solder material in a satisfactory manner. As a result, heat resistance in a laminating direction decreases, and thus it is possible to transfer heat, which is generated from the semiconductor element, to the heat sink side in a satisfactory manner.

In addition, PTL 5 suggests a power module substrate with heat sink in which one of the metal layer and the heat sink is constituted by aluminum or an aluminum alloy, the other side is constituted by copper or a copper alloy, and the metal layer and the heat sink are subjected to solid-phase diffusion bonding. In the power module substrate with heat sink, the metal layer and the heat sink are subjected to the solid-phase diffusion bonding, and thus heat resistance is small, and heat dissipation characteristics are excellent.

CITATION LIST

Patent Literature

[PTL 1] Japanese Patent Publication No. 3171234
[PTL 2] Japanese Unexamined Patent Application, First Publication No. 2004-172378
[PTL 3] Japanese Unexamined Patent Application, First Publication No. 2008-208442
[PTL 4] Japanese Unexamined Patent Application, First Publication No. 2014-160799
[PTL 5] Japanese Unexamined Patent Application, First Publication No. 2014-099596

DISCLOSURE OF INVENTION

Technical Problem

However, in a heat sink having a complicated structure in which a flow passage of a cooling medium and the like are formed on an inner side, the heat sink may be manufactured by using a casted aluminum alloy that contains a relatively large amount of Si.

Here, in a case of subjecting the aluminum alloy member formed from the casted aluminum alloy that contains a relatively large amount of Si, and the metal member formed from copper, nickel, or silver to the solid-phase diffusion bonding as described in PTL 5, it is confirmed that a lot of Kirkendall voids, which occur due to unbalance of mutual diffusion, occur in the vicinity of a bonding interface. When the Kirkendall voids exist between the power module substrate and the heat sink, heat resistance increases, and thus there is a problem in that heat dissipation characteristics deteriorate.

The invention has been made in consideration of the above-described circumstances, and an object thereof is to provide a bonded body in which an aluminum alloy member formed from an aluminum alloy that contains a relatively large amount of Si, and a metal member formed from copper, nickel, or silver are bonded to each other in a satisfactory manner, and heat resistance in a laminating direction is low, a power module substrate with heat sink and a heat sink which include the bonded body, a method of manufacturing a bonded body, and a method of manufacturing a power module substrate with heat sink, and a method of manufacturing a heat sink.

Solution to Problem

To solve the above-described problem, according to an aspect of the invention, a bonded body is provided in which an aluminum alloy member formed from an aluminum alloy, and a metal member formed from copper, nickel, or silver are bonded to each other. The aluminum alloy member is constituted by an aluminum alloy in which a concentration of Si is set in a range of 1 mass % to 25 mass %. The aluminum alloy member and the metal member are subjected to solid-phase diffusion bonding. A compound layer, which is formed through diffusion of Al of the aluminum alloy member and a metal element of the metal member, is provided at a bonding interface between the aluminum alloy member and the metal member. A Mg-concentrated layer, in which a concentration of Mg is set to 3 mass % or greater, is formed at the inside of the compound layer, and the thickness of the Mg-concentrated layer is set in a range of 1 µm to 30 µm.

Furthermore, in the aspect of the invention, the metal member is constituted by copper, a copper alloy, nickel, a nickel alloy, silver, or a silver alloy.

According to the bonded body configured as described above, since the compound layer, which is formed through diffusion of Al of the aluminum alloy member and a metal element of the metal member, is provided at the bonding interface between the aluminum alloy member and the metal member, the Mg-concentrated layer, in which the concentration of Mg is set to 3 mass % or greater, is formed at the inside of the compound layer, and the thickness of the Mg-concentrated layer is set in a range of 1 µm to 30 µm, it is possible to obstruct diffusion migration of a metal element that constitutes the metal member due to the Mg-concentrated layer, and thus occurrence of a Kirkendall void is suppressed. As a result, it is possible to lower heat resistance in a laminating direction.

According to another aspect of the invention, a power module substrate with heat sink is provided which includes an insulating layer, a circuit layer that is formed on one surface of the insulating layer, a metal layer that is formed on the other surface of the insulating layer, and a heat sink that is disposed on a surface, which is opposite to the insulating layer, of the metal layer. In the metal layer, a bonding surface with the heat sink is constituted by copper, nickel, or silver. In the heat sink, a bonding surface with the metal layer is constituted by an aluminum alloy in which a concentration of Si is set in a range of 1 mass % to 25 mass %. The heat sink and the metal layer are subjected to solid-phase diffusion bonding. A compound layer, which is formed through diffusion of Al of the heat sink and a metal element that constitutes the bonding surface of the metal layer, is provided at a bonding interface between the heat sink and the metal layer. A Mg-concentrated layer, in which a concentration of Mg is set to 3 mass % or greater, is formed at the inside of the compound layer, and the thickness of the Mg-concentrated layer is set in a range of 1 µm to 30 µm.

According to the power module substrate with heat sink which is configured as described above, since the compound layer, which is formed through diffusion of Al of the heat sink and a metal element that constitutes the bonding surface of the metal layer, is provided at a bonding interface between the heat sink and the metal layer, the Mg-concentrated layer, in which the concentration of Mg is set to 3 mass % or greater, is formed at the inside of the compound layer, and the thickness of the Mg-concentrated layer is set in a range of 1 µm to 30 µm, it is possible to obstruct diffusion migration of a metal element that constitutes the metal layer due to the Mg-concentrated layer, and thus occurrence of a Kirkendall void is suppressed. As a result, heat resistance in a laminating direction is low, and heat dissipation characteristics are particularly excellent.

According to still another aspect of the invention, a heat sink is provided including a heat sink main body, and a metal member layer that is bonded to the heat sink main body. The metal member layer is formed from copper, nickel, or silver. The heat sink main body is constituted by an aluminum alloy in which a concentration of Si is set in a range of 1 mass % to 25 mass %. The heat sink main body and the metal member layer are subjected to solid-phase diffusion bonding. A compound layer, which is formed through diffusion of Al of the heat sink main body and a metal element that constitutes the metal member layer, is provided at a bonding interface between the heat sink main body and the metal member layer. A Mg-concentrated layer, in which a concentration of Mg is set to 3 mass % or greater, is formed at the inside of the compound layer, and the thickness of the Mg-concentrated layer is set in a range of 1 µm to 30 µm.

According to the heat sink configured as described above, since the compound layer, which is formed through diffusion of Al of the heat sink main body and a metal element that constitutes the metal member layer, is provided at the bonding interface between the heat sink main body and the metal member layer, the Mg-concentrated layer, in which a concentration of Mg is set to 3 mass % or greater, is formed at the inside of the compound layer, and the thickness of the Mg-concentrated layer is set in a range of 1 µm to 30 µm, it is possible to obstruct diffusion migration of a metal element that constitutes the metal member layer due to the Mg-concentrated layer, and thus occurrence of a Kirkendall void is suppressed. As a result, heat resistance in a laminating direction is low, and heat dissipation characteristics are particularly excellent.

According to still another aspect of the invention, a method is provided of manufacturing a bonded body in which an aluminum alloy member formed from an aluminum alloy, and a metal member formed from copper, nickel, or silver are bonded to each other. The aluminum alloy member is constituted by an aluminum alloy in which a concentration of Si is set in a range of 1 mass % to 25 mass %. In the aluminum alloy member before bonding, a concentration of Mg at least in a region which ranges from a bonding surface with the metal member to 50 µm in a depth direction is set in a range of 0.3 mass % to 15 mass %. The aluminum alloy member and the metal member are subjected to solid-phase diffusion bonding.

According to the method of manufacturing a bonded body which is configured as described above, since in the aluminum alloy member before bonding, the concentration of Mg at least in a region which ranges from a bonding surface with the metal member to 50 µm in a depth direction is set in a range of 0.3 mass % to 15 mass %, it is possible to suppress diffusion migration of a metal element, which constitutes the metal member, more than necessary during the solid-phase diffusion bonding, and thus it is possible to suppress occurrence of a Kirkendall void due to Mg that exists in the vicinity of the bonding surface.

Here, in the method of manufacturing a bonded body according to the aspect of the invention, it is preferable that the aluminum alloy member and the metal member be laminated, and be electrically heated while being pressurized in a laminating direction to subject the aluminum alloy member and the metal member to the solid-phase diffusion bonding.

In this case, since the aluminum alloy member and the metal member are electrically heated while being pressurized in the laminating direction, it is possible to raise a temperature-rising rate, and thus it is possible to perform the solid-phase diffusion bonding in a relatively short time. According to this, for example, even when bonding is performed in the atmosphere, an effect of oxidization on the bonding surface is small, and thus it is possible to bond the aluminum alloy member and the metal member in a satisfactory manner.

According to still another aspect of the invention, a method is provided of manufacturing a power module substrate with heat sink which includes an insulating layer, a circuit layer that is formed on one surface of the insulating layer, a metal layer that is formed on the other surface of the insulating layer, and a heat sink that is disposed on a surface, which is opposite to the insulating layer, of the metal layer. In the metal layer, a bonding surface with the heat sink is constituted by copper, nickel, or silver. In the heat sink, a bonding surface with the metal layer is constituted by an aluminum alloy in which a concentration of Si is set in a range of 1 mass % to 25 mass %. In the heat sink before bonding, a concentration of Mg at least in a region which ranges from a bonding surface with the metal layer to 50 µm in a depth direction is set in a range of 0.3 mass % to 15 mass %. The heat sink and the metal layer are subjected to solid-phase diffusion bonding.

According to the method of manufacturing a power module substrate with heat sink which is configured as described above, since in the heat sink before bonding, the concentration of Mg at least in a region which ranges from a bonding surface with the metal layer to 50 µm in a depth direction is set in a range of 0.3 mass % to 15 mass %, it is possible to suppress diffusion migration of a metal element, which constitutes the bonding surface of the metal layer, more than necessary during the solid-phase diffusion bonding, and thus it is possible to suppress occurrence of a Kirkendall void due to Mg that exists in the vicinity of the bonding surface.

Accordingly, it is possible to manufacture a power module substrate with heat sink in which heat resistance in the laminating direction is low and heat dissipation characteristics are excellent.

Here, in the method of manufacturing a power module substrate with heat sink according to the aspect of the invention, it is preferable that the heat sink and the metal layer be laminated, and be electrically heated while being pressurized in a laminating direction to subject the heat sink and the metal layer to the solid-phase diffusion bonding.

In this case, since the heat sink and the metal layer are electrically heated while being pressurized in the laminating direction, it is possible to raise a temperature-rising rate, and thus it is possible to perform the solid-phase diffusion bonding in relatively short time. According to this, for example, even when bonding is performed in the atmosphere, an effect of oxidization on the bonding surface is small, and thus it is possible to bond the heat sink and the metal layer in a satisfactory manner.

According to still another aspect of the invention, a method is provided of manufacturing a heat sink including a heat sink main body and a metal member layer that is bonded to the heat sink main body. The metal member layer is formed from copper, nickel, or silver. The heat sink main body is constituted by an aluminum alloy in which a concentration of Si is set in a range of 1 mass % to 25 mass %. In the heat sink main body before bonding, a concentration of Mg at least in a region which ranges from a bonding surface with the metal member layer to 50 µm in a depth direction is set in a range of 0.3 mass % to 15 mass %. The heat sink main body and the metal member layer are subjected to solid-phase diffusion bonding.

According to the method of manufacturing a heat sink which is configured as described above, since in the heat sink main body before bonding, a concentration of Mg at least in a region which ranges from a bonding surface with the metal member layer to 50 µm in a depth direction is set in a range of 0.3 mass % to 15 mass %, it is possible to suppress diffusion migration of a metal element, which constitutes the metal member layer, more than necessary during the solid-phase diffusion bonding, and thus it is possible to suppress occurrence of a Kirkendall void due to Mg that exists in the vicinity of the bonding surface.

As a result, it is possible to manufacture a heat sink in which heat resistance in the laminating direction is low and heat dissipation characteristics are excellent.

Here, in the method of manufacturing a heat sink according to the aspect of the invention, it is preferable that the heat sink main body and the metal member layer be laminated, and be electrically heated while being pressurized in a laminating direction to subject the heat sink main body and the metal member layer to the solid-phase diffusion bonding.

In this case, since the heat sink main body and the metal member layer are electrically heated while being pressurized in the laminating direction, it is possible to raise a temperature-rising rate, and thus it is possible to perform the solid-phase diffusion bonding in relatively short time. According to this, for example, even when bonding is performed in the atmosphere, an effect of oxidization on the bonding surface is small, and thus it is possible to bond the heat sink main body and the metal member layer in a satisfactory manner.

Advantageous Effects of Invention

According to the aspects of the invention, it is possible to provide a bonded body in which an aluminum alloy member formed from an aluminum alloy that contains a relatively large amount of Si, and a metal member formed from copper, nickel, or silver are bonded to each other in a satisfactory manner, and heat resistance in a laminating direction is low, a power module substrate with heat sink and a heat sink which include the bonded body, a method of manufacturing a bonded body, and a method of manufacturing a power module substrate with heat sink, and a method of manufacturing a heat sink.

BEST MODE FOR CARRYING OUT THE INVENTION

First Embodiment

Hereinafter, description will be given of embodiments of the invention with reference to the accompanying drawings.

Figure 1:
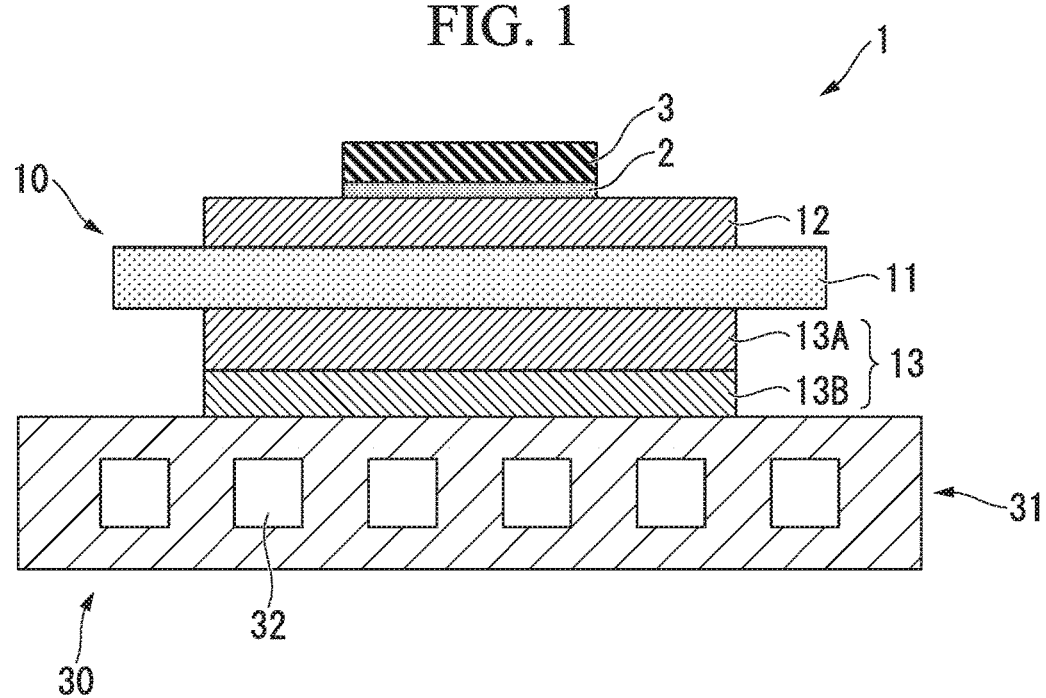
FIG. 1 is a schematic view illustrating a power module including a power module substrate with heat sink according to a first embodiment of the invention.

FIG. 1 illustrates a power module 1 using a power module substrate with heat sink 30 according to a first embodiment of the invention.

The power module 1 includes the power module substrate with heat sink 30, and a semiconductor element 3 that is bonded to one surface (an upper surface in FIG. 1) of the power module substrate with heat sink 30 through a solder layer 2.

The power module substrate with heat sink 30 includes a power module substrate 10 and a heat sink 31 that is bonded to the power module substrate 10.

The power module substrate 10 includes a ceramic substrate 11 that constitutes an insulating layer, a circuit layer 12 that is arranged on one surface (an upper surface in FIG. 1) of the ceramic substrate 11, and a metal layer 13 that is arranged on the other surface of the ceramic substrate 11.

The ceramic substrate 11 is constituted by ceramics such as silicon nitride ($Si_3N_4$), aluminum nitride (AlN), and alumina ($Al_2O_3$), which are excellent in insulating properties and heat dissipation. In this embodiment, the ceramic member 11 is constituted by the aluminum nitride (AlN), which is is particularly excellent in heat dissipation. In addition, for example, the thickness of the ceramic substrate 11 is set in a range of 0.2 to 1.5 mm, and is set to 0.635 mm in this embodiment.

Figure 4:
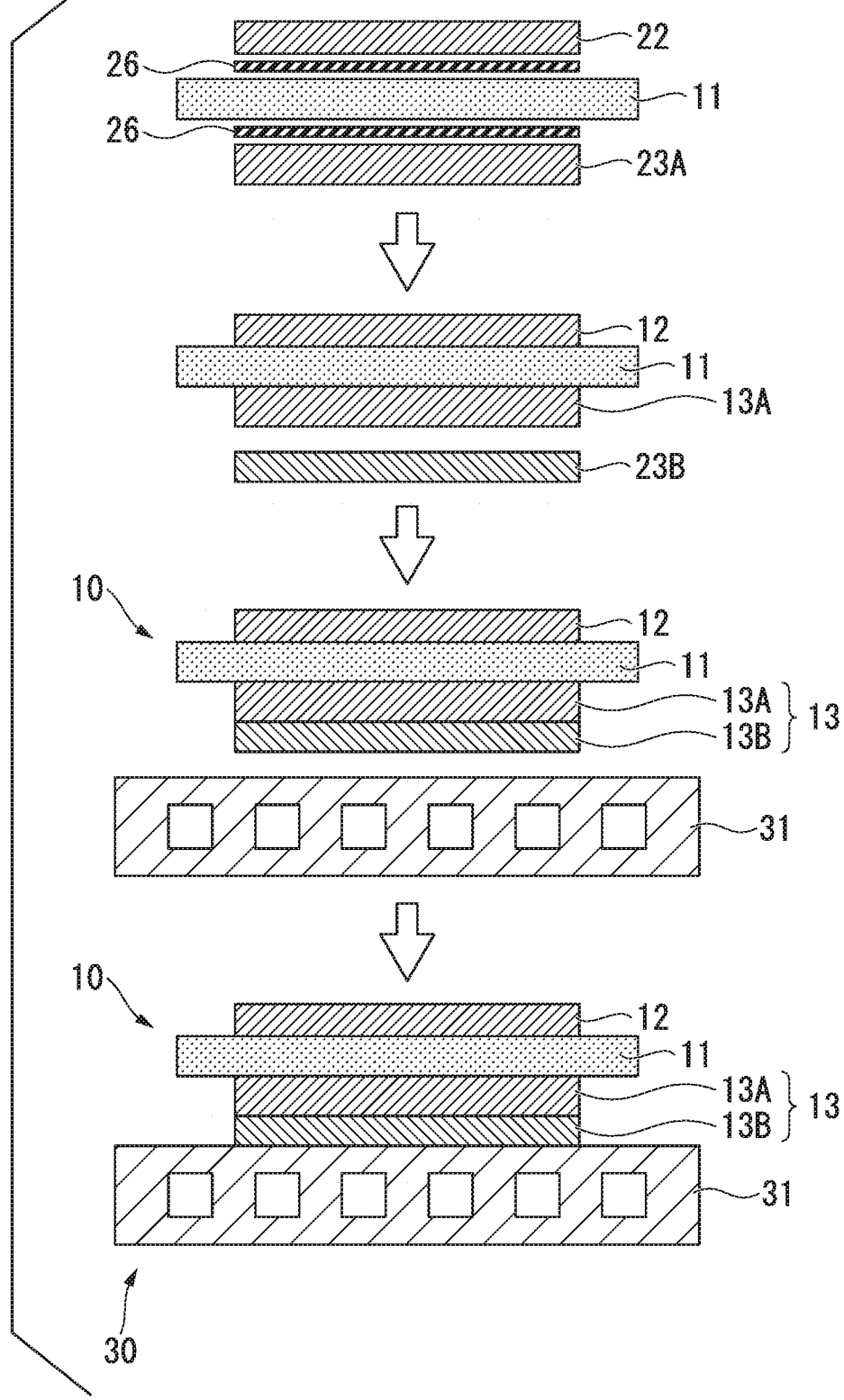
FIG. 4 is a schematic view illustrating the method of manufacturing the power module substrate with heat sink according to the first embodiment.

As illustrated in FIG. 4, the circuit layer 12 is formed by bonding an aluminum plate 22, which is formed from aluminum or an aluminum alloy, onto one surface of the ceramic substrate 11. In this embodiment, the circuit layer 12 is formed by bonding a rolled plate (aluminum plate 22) of aluminum (2N aluminum) having the purity of 99 mass % or greater to the ceramic substrate 11. Furthermore, the thickness of the aluminum plate 22, which becomes the circuit layer 12, is set in a range of 0.1 mm to 1.0 mm, and is set to 0.6 mm in this embodiment.

As illustrated in FIG. 1, the metal layer 13 includes an Al layer 13A that is arranged on the other surface of the ceramic substrate 11, and a Cu layer 13B that is laminated on a surface, which is opposite to a surface to which the ceramic substrate 11 is bonded, of the Al layer 13A.

As illustrated in FIG. 4, the Al layer 13A is formed by bonding an aluminum plate 23A, which is formed from aluminum or an aluminum alloy, onto the other surface of the ceramic substrate 11. In this embodiment, the Al layer 13A is formed by bonding a rolled plate (aluminum plate 23A) of aluminum (2N aluminum) having the purity of 99 mass % or greater to the ceramic substrate 11. The thickness of the aluminum plate 23A that is bonded to the ceramic substrate 11 is set in a range of 0.1 mm to 3.0 mm, and is set to 0.6 mm in this embodiment.

As illustrated in FIG. 4, the Cu layer 13B is formed by bonding a copper plate 23B, which is formed from copper or a copper alloy, to the other surface of the Al layer 13A. In this embodiment, the Cu layer 13B is formed by bonding a rolled plate (copper plate 23B) of oxygen-free copper to the other surface of the Al layer 13A. The thickness of the copper layer 13B is set in a range of 0.1 mm to 6 mm, and is set to 1 mm in this embodiment.

The heat sink 31 is configured to radiate heat on a power module substrate 10 side. In this embodiment, as illustrated in FIG. 1, the heat sink 31 is provided with a flow passage 32 through which a cooling medium flows. The heat sink 31 is constituted by an aluminum alloy in which a concentration of Si is set in a range of 1 mass % to 25 mass %. Specifically, the heat sink 31 is constituted by ACD12 (solidus temperature: 515° C.), which is a die-casting aluminum alloy defined in JIS H 2118:2006. In addition, the ACD12 is an aluminum alloy that contains Cu in a range of 1.5 mass % to 3.5 mass %, and Si in a range of 9.6 mass % to 12.0 mass %. In the aluminum alloy, a concentration of Si is preferably 5 mass % to 20 mass %, and more preferably 7 mass % to 13 mass %, but there is no limitation thereto.

Here, the heat sink 31 and the metal layer 13 (Cu layer 13B) are subjected to solid-phase diffusion bonding.

Figure 2:
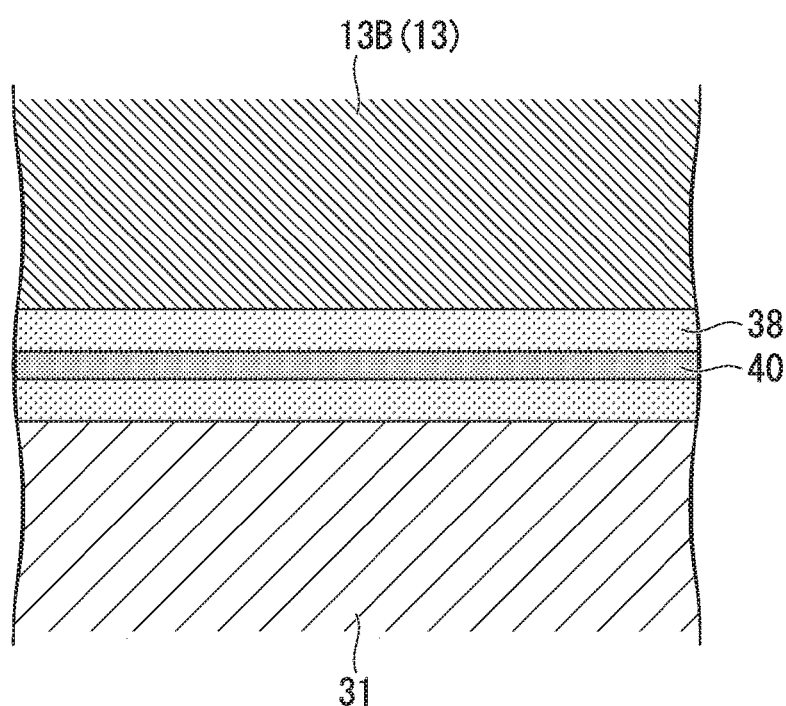
FIG. 2 is an enlarged cross-sectional view illustrating a bonding interface between a heat sink and a metal layer (Cu layer) of the power module substrate with heat sink as illustrated in FIG. 1.

As illustrated in FIG. 2, a compound layer 38, which contains Al and Cu, is formed at a bonding interface between the metal layer 13 (Cu layer 13B) and the heat sink 31.

The compound layer 38 is formed through mutual diffusion of Al atoms of the heat sink 31 and Cu atoms of the Cu layer 13B. The compound layer 38 has a concentration gradient in which the concentration of Al atoms further decreases and the concentration of Cu atoms further increases as it goes toward the Cu layer 13B from the heat sink 31.

The compound layer 38 is constituted by an intermetallic compound composed of Cu and Al. In this embodiment, the compound layer 38 has a structure in which a plurality of the intermetallic compounds are laminated along the bonding interface. Here, the thickness of the compound layer 38 is set in a range of 1 μm to 80 μm, and preferably in a range of 5 μm to 80 μm.

In this embodiment, the compound layer 38 has a structure in which three kinds of intermetallic compounds are laminated. In the order from the heat sink 31 side toward the Cu layer 13B side, a θ-phase and $\eta_2$-phase are laminated along the bonding interface between the heat sink 31 and the Cu layer 13B, and at least one phase among a $\xi_2$-phase, a δ-phase, and a $\gamma_2$-phase is laminated.

In addition, at the bonding interface between the compound layer 38 and the Cu layer 13B, oxides are dispersed in a layer shape along the bonding interface. Furthermore, in this embodiment, the oxides are composed of aluminum oxides such as alumina ($Al_2O_3$). Furthermore, the oxides are dispersed at the interface between the compound layer 38 and the Cu layer 13B in a disconnected state, and a region in which the compound layer 38 and the Cu layer 13B are in direct contact with each other also exists. In addition, the oxides may be dispersed at the inside of the θ-phase, the $\eta_2$-phase, or at least one phase among the $\xi_2$-phase, the δ-phase, and the $\gamma_2$-phase in a layer shape.

In addition, as illustrated in FIG. 2, a Mg-concentrated layer 40 in which a concentration of Mg is set to 3 mass % or greater is formed at the inside of the compound layer 38, and the thickness of the Mg-concentrated layer 40 is set in a range of 1 μm to 30 μm. The concentration of Mg in the Mg-concentrated layer 40 is preferably 5 mass % to 15 mass %, and more preferably 7 mass % to 9 mass %, but there is no limitation to the ranges.

Figure 3:
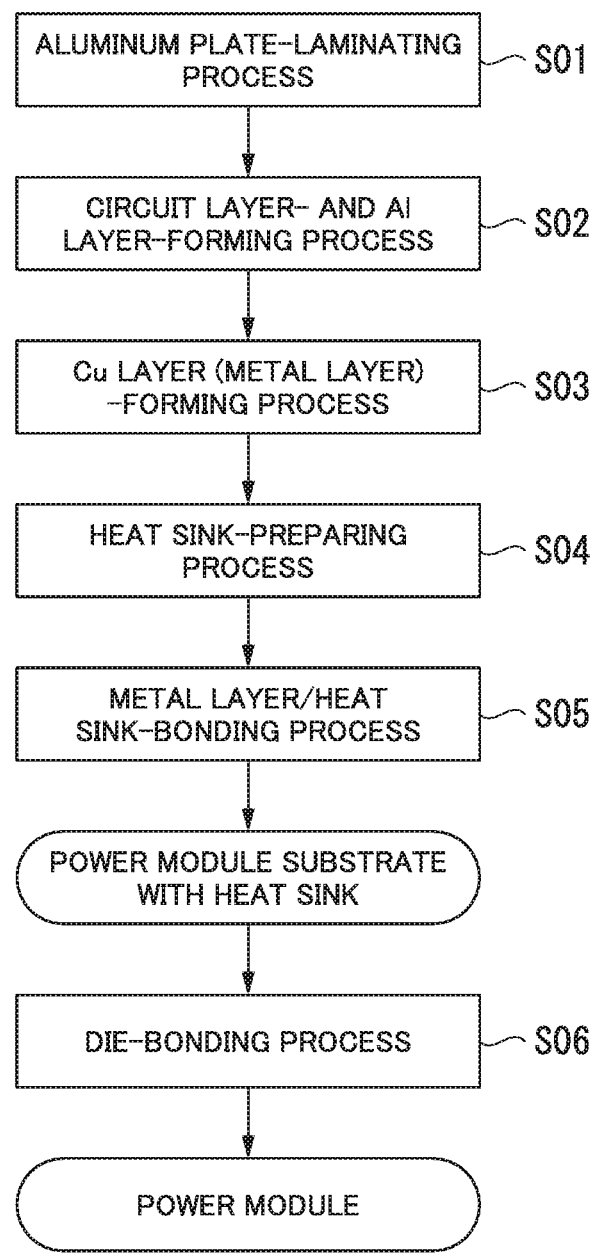
FIG. 3 is a flowchart illustrating a method of manufacturing the power module substrate with heat sink according to the first embodiment.

Next, description will be given of a method of manufacturing the power module substrate with heat sink 30 according to this embodiment with reference to FIG. 3 to FIG. 5.

(Aluminum Plate-Laminating Process S01)

First, as illustrated in FIG. 4, the aluminum plate 22, which becomes the circuit layer 12, is laminated on one surface of the ceramic substrate 11 through Al—Si-based brazing material foil 26.

In addition, the aluminum plate 23A, which becomes the Al layer 13A, is laminated on the other surface of the ceramic substrate 11 through Al—Si-based brazing material foil 26. Furthermore, in this embodiment, as the Al—Si-based brazing material foil 26, Al-8 mass % Si alloy foil having a thickness of 10 μm is used.

(Circuit Layer- and Al Layer-Forming Process S02)

In addition, the resultant laminated body is disposed in a vacuum heating furnace and is heated therein in a pressurized state (pressure is set to 1 to 35 kgf/cm$^2$ (0.10 to 3.43 MPa)) in a laminating direction to bond the aluminum plate 22 and the ceramic substrate 11, thereby forming the circuit layer 12. In addition, the ceramic substrate 11 and the aluminum plate 23A are bonded to form the Al layer 13A.

Here, it is preferable that the pressure inside the vacuum heating furnace be set in a range of $10^{-6}$ Pa to $10^{-3}$ Pa, a heating temperature be set to 600° C. to 650° C., and retention time be set in a range of 30 minutes to 180 minutes.

(Cu Layer (Metal Layer)-Forming Process S03)

Next, the copper plate 23B, which becomes the Cu layer 13B, is laminated on the other surface side of the Al layer 13A.

In addition, the resultant laminated body is disposed in a vacuum heating furnace and is heated therein in a pressurized state (pressure is set to 3 to 35 kgf/cm$^2$ (0.29 to 3.43 MPa)) in a laminating direction to subject the Al layer 13A and the copper plate 23B to solid-phase diffusion bonding, thereby forming the metal layer 13.

Here, it is preferable that the pressure inside the vacuum heating furnace be set in a range of $10^{-6}$ Pa to $10^{-3}$ Pa, a heating temperature be set to 400° C. to 548° C., and retention time be set in a range of 5 minutes to 240 minutes.

Furthermore, in respective bonding surfaces, which are subjected to the solid-phase diffusion bonding, of the Al layer 13A and the copper plate 23B, scratches on the bonding surfaces are removed in advance and thus the bonding surfaces are made to be smooth.

(Heat Sink-Preparing Process S04)

Next, the heat sink 31 to be bonded is prepared. At this time, as illustrated in FIG. 5, a concentration of Mg in a region 31A, which ranges from a bonding surface with the metal layer 13 (Cu layer 13B) in the heat sink 31 to 50 μm in a depth direction, is set to a range of 0.3 mass % to 15 mass %.

Figure 5:
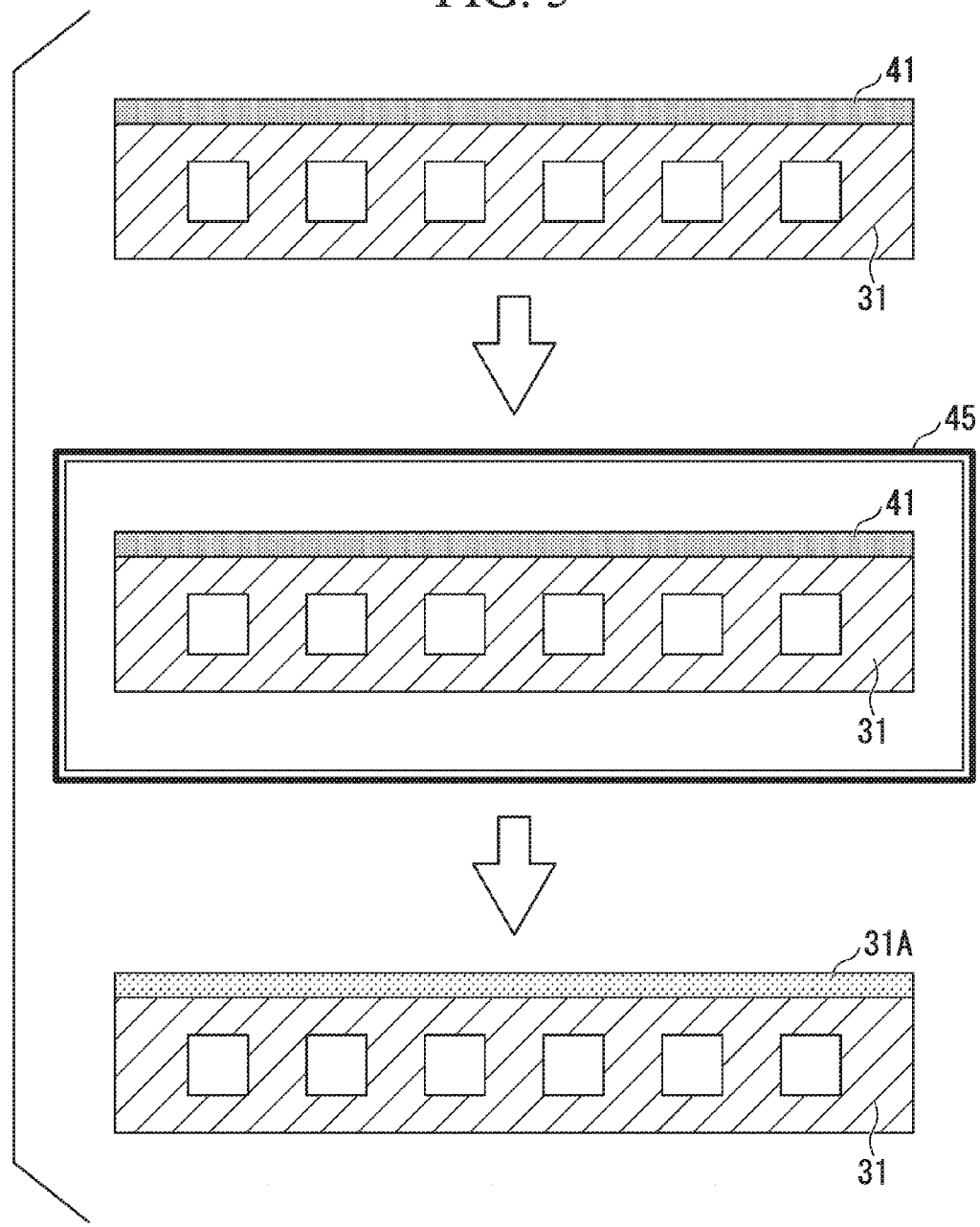
FIG. 5 is a schematic view illustrating a method of adding Mg to a bonding surface of a heat sink before bonding in the method of manufacturing the power module substrate with heat sink as illustrated in FIG. 4.

In this embodiment, as illustrated in FIG. 5, Mg foil 41 having a thickness of 2 μm to 25 μm is disposed on the bonding surface with the metal layer 13 (Cu layer 13B) in the heat sink 31, and the resultant body is put in a heat treatment furnace 45. Then, a heat treatment is performed under conditions of a temperature of 420° C. to 500° C., and retention time of 30 minutes to 240 minutes to allow Mg to diffuse to the heat sink 31 side. According to this, the concentration of Mg in the region 31A, which ranges from the bonding surface to 50 μm in the depth direction, is set in a range of 0.3 mass % to 15 mass %. In addition, an atmosphere inside the heat treatment furnace 45 in the heat treatment is preferably set to, for example, a nitrogen atmosphere or a vacuum atmosphere. The heat treatment is preferably performed under conditions of a temperature of 450° C. to 480° C., and retention time of 60 minutes to 120 minutes, but there is no limitation to the conditions.

Furthermore, it is possible to use various kinds of Mg-containing foil such as Al—Mg foil and Al—Mg—Si foil in addition to the Mg foil. In addition, it is possible to allow Mg to diffuse by disposing Mg on the bonding surface through sputtering and the like in addition to the foil, and by performing a heat treatment.

In addition, in a case where the concentration of Mg in the region 31A that ranges from the bonding surface to 50 μm in the depth direction is greater than 15 mass %, it is possible to set the concentration of Mg in the range of 0.3 mass % to 15 mass % by performing grinding or cutting from the bonding surface in the depth direction. The concentration of Mg in the region 31A is preferably 2 mass % to 10.8 mass %, and more preferably 4.9 mass % to 8.3 mass %, but there is no limitation to the ranges.

(Metal Layer/Heat Sink-Bonding Process S05)

Next, the metal layer 13 (Cu layer 13B) and the heat sink 31 are laminated, and the resultant laminated body is disposed in a vacuum heating furnace and is heated therein in a pressurized state (pressure is set to 5 to 35 kgf/cm² (0.49 to 3.43 MPa)) in a laminating direction to subject the metal layer 13 (Cu layer 13B) and the heat sink 31 to solid-phase diffusion bonding. Furthermore, in respective bonding surfaces, which are subjected to the solid-phase diffusion bonding, of the metal layer 13 (Cu layer 13B) and the heat sink 31, scratches on the bonding surface are removed in advance and thus the bonding surfaces are made to be smooth. A pressure during the pressurization is preferably set to 8 to 20 kgl/cm² (0.78 to 1.96 MPa), but there is no limitation to this range.

Here, it is preferable that a pressure inside the vacuum heating furnace be set in a range of $10^{-6}$ Pa to $10^{-3}$ Pa, a heating temperature be set in a range of 400° C. to 520° C., and retention time be set in a range of 0.25 hours to 3 hours. It is more preferable that the pressure inside the vacuum heating furnace be set in a range of $10^{-5}$ Pa to $10^{-4}$ Pa, the heating temperature be set in a range of 480° C. to 510° C., and the retention time be set in a range of 0.5 hours to 2 hours. However, there is no limitation to the ranges.

In the metal layer/heat sink-bonding process S05, Cu atoms in the Cu layer 13B diffuse to the heat sink 31 side. Accordingly, as illustrated in FIG. 2, the compound layer 38 is formed, and the Mg-concentrated layer 40 is formed in the compound layer 38.

In this manner, the power module substrate with heat sink 30 according to this embodiment is manufactured.

(Die-Bonding Process S06)

Next, the semiconductor element 3 is laminated on one surface (front surface) of the circuit layer 12 through a solder material 2, and the resultant laminated body is subjected to solder bonding in a reducing furnace.

As described above, the power module 1 according to this embodiment is manufactured.

According to the power module substrate with heat sink 30 according to this embodiment which is configured as described, the heat sink 31 is constituted by an aluminum alloy in which the concentration of Si is set in a range of 1 mass % to 25 mass %. Specifically, the heat sink 31 is constituted by ACD12 (Concentration of Si: 9.6 mass % to 12.0 mass %), which is a die-casting aluminum alloy defined in JIS H 2118:2006. Accordingly, it is possible to constitute the heat sink 31 with a complicated structure including the flow passage 32, and thus it is possible to improve a heat dissipation performance.

In addition, in this embodiment, the compound layer 38, which is formed from an intermetallic compound of Al and Cu, is formed at the bonding interface between the heat sink 31 and the metal layer 13 (Cu layer 13B), the Mg-concentrated layer 40 in which the concentration of Mg is set to 3 mass % or greater is formed at the inside of the compound layer 38, and the thickness of the Mg-concentrated layer 40 is set in a range of 1 μm to 30 μm. Accordingly, it is possible to obstruct diffusion migration of a Cu atom of the metal layer 13 (Cu layer 13B) due to the Mg-concentrated layer 40, and thus it is possible to suppress occurrence of a Kirkendall void. In addition, it is possible to allow the Cu atom of the metal layer 13 (Cu layer 13B) to sufficiently diffuse to the heat sink 31 side, and thus it is possible to reliably subject the heat sink 31 and the metal layer 13 (Cu layer 13B) to the solid-phase diffusion bonding.

Accordingly, in the power module substrate with heat sink 30, heat resistance in the laminating direction is low and thus it is possible to suppress deterioration of the heat dissipation characteristics.

Here, in a case where the thickness of the Mg-concentrated layer 40 is less than 1 μm, there is a concern that the diffusion migration of the Cu atom is not sufficiently suppressed, and thus it is difficult to suppress occurrence of the Kirkendall void. On the other hand, in a case where the thickness of the Mg-concentrated layer 40 is greater than 30 μm, there is a concern that diffusion of the Cu atom is deficient and thus bonding may be insufficient.

As described above, in this embodiment, the thickness of the Mg-concentrated layer 40 is set in a range of 1 μm to 30 μm.

Furthermore, it is preferable that the lower limit of the thickness of the Mg-concentrated layer 40 be set to 7 μm or greater, and more preferably 10 μm or greater so as to reliably suppress occurrence of the Kirkendall void. In addition, it is preferable that the upper limit of the thickness of the Mg-concentrated layer 40 be set to 25 μm or less, and more preferably 20 μm or less so as to reliably subject the heat sink 31 and the metal layer 13 (Cu layer 13B) to the solid-phase diffusion bonding.

In addition, in this embodiment, the compound layer 38, which is constituted by a compound layer of Cu and Al, is formed at the bonding interface between the metal layer 13 (Cu layer 13B) and the heat sink 31, and the compound layer 38 has a structure in which a plurality of intermetallic compounds are laminated along the bonding interface, and thus it is possible to suppress great growth of the intermetallic compounds which are brittle. In addition, a volume variation at the inside of the compound layer 38 decreases, and thus an internal strain is suppressed.

In addition, in this embodiment, at the bonding interface between the Cu layer 13B and the compound layer 38, oxides are dispersed in a layer shape along the bonding interface. Accordingly, an oxide film formed on the bonding surface of the heat sink 31 is reliably broken, and mutual diffusion of Cu and Al sufficiently progresses, and thus the Cu layer 13B and the heat sink 31 are reliably bonded to each other.

In addition, according to the method of manufacturing the power module substrate with heat sink 30 according to this embodiment, in the heat sink 31 before bonding which is prepared in the heat sink-preparing process S04, the concentration of Mg in the region 31A, which ranges from the bonding surface with the metal layer 13 (Cu layer 13B) to 50 μm in the depth direction in the heat sink 31, is set in a range of 0.3 mass % to 15 mass %. Accordingly, in the metal layer/heat sink-bonding process S05, when the heat sink 31 and the metal layer 13 (Cu layer 13B) are subjected to the solid-phase diffusion bonding, it is possible to suppress diffusion migration of Cu atoms of the Cu layer 13B more than necessary, and thus it is possible to suppress occurrence of the Kirkendall void.

Accordingly, it is possible to manufacture the power module substrate with heat sink 30 in which heat resistance in the laminating direction is low and heat dissipation characteristics are excellent.

In addition, in this embodiment, the Mg foil 41 having a thickness of 2 μm to 25 μm is disposed on a bonding surface with the metal layer 13 (Cu layer 13B) in the heat sink 31, and the heat treatment is performed under conditions of a temperature of 420° C. to 500° C. and retention time of 30 minutes to 240 minutes to allow Mg to diffuse to the heat sink 31 side. According to this, the concentration of Mg in the region 31A, which ranges from the bonding surface to 50 μm in the depth direction, is set to a range of 0.3 mass % to 15 mass %. As a result, it is possible to dispose Mg in the bonding surface with the metal layer 13 (Cu layer 13B), and it is possible to form the Mg-concentrated layer 40 in the subsequent metal layer/heat sink-bonding process S05.

In addition, in a case where scratches exist on the bonding surface during the solid-phase diffusion bonding, there is a concern that a gap may occur in the bonding interface. However, in this embodiment, bonding surfaces of the Cu layer 13B (copper plate 23B) and the heat sink 31 are made to be flat by removing scratches on the bonding surface, and are subjected to the solid-phase diffusion bonding, and thus it is possible to suppress occurrence of a gap in the bonding interface. As a result, it is possible to reliably perform the solid-phase diffusion bonding.

Second Embodiment

Figure 6:
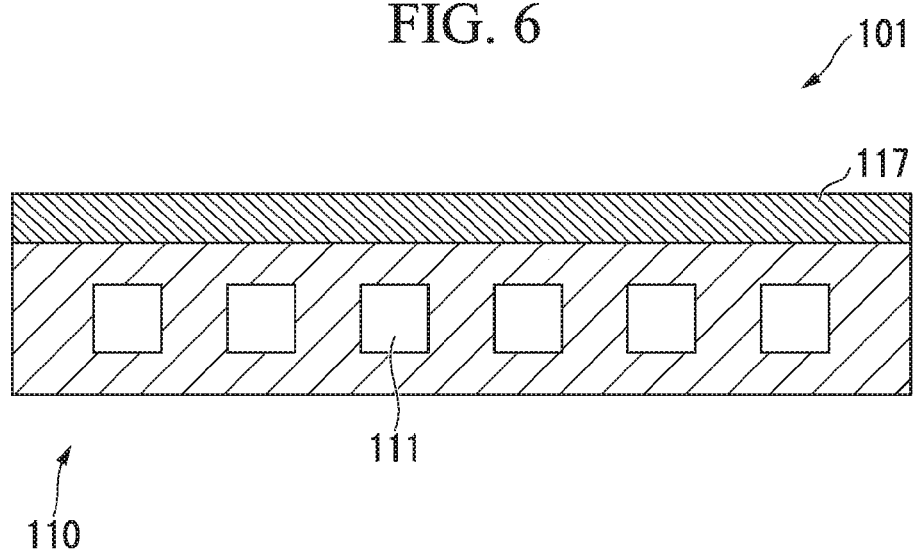
FIG. 6 is a schematic view illustrating a heat sink according to a second embodiment of the invention.

Next, description will be given of a heat sink according to a second embodiment of the invention. FIG. 6 illustrates a heat sink 101 according to the second embodiment of the invention.

Figure 9:
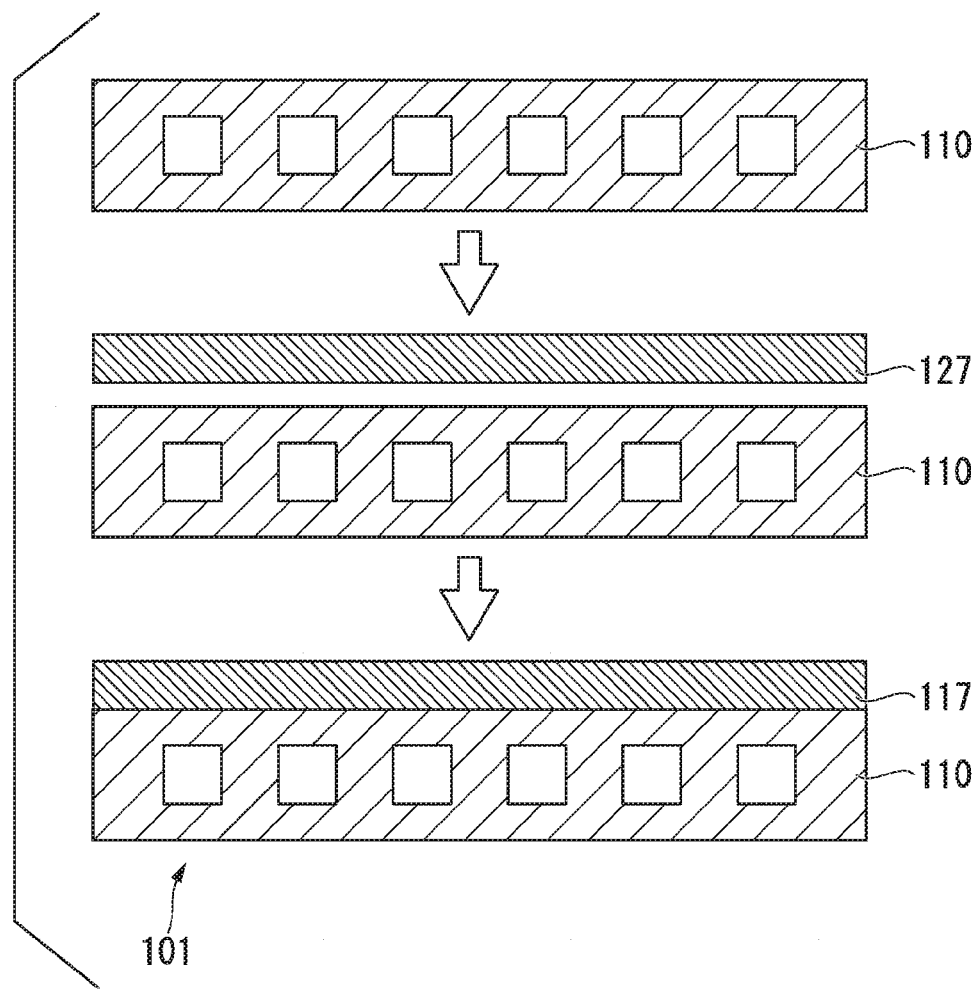
FIG. 9 is a schematic view illustrating the method of manufacturing the heat sink according to the second embodiment.

The heat sink 101 includes a heat sink main body 110, and a metal member layer 117 that is laminated on one surface (upper side in FIG. 6) of the heat sink main body 110 and is formed from copper, nickel, or silver. In this embodiment, as illustrated in FIG. 9, the metal member layer 117 is constructed by bonding a metal plate 127 that is constituted by a rolled plate of oxygen-free copper to the heat sink main body 110.

The heat sink main body 110 is provided with a flow passage 111 through which a cooling medium flows. The heat sink main body 110 is constituted by an aluminum alloy in which a concentration of Si is set in a range of 1 mass % to 25 mass %. Specifically, the heat sink main body 110 is constituted by an aluminum alloy that contains Si in a range of 9.6 mass % to 12 mass %, and Mg in a range of 0.3 mass % to 15 mass %. The concentration of Si in the aluminum alloy is preferably 5 mass % to 20 mass %, and more preferably 7 mass % to 13 mass %, but there is no limitation to the ranges.

Here, the heat sink main body 110 and the metal member layer 117 are subjected to the solid-phase diffusion bonding.

Figure 7:
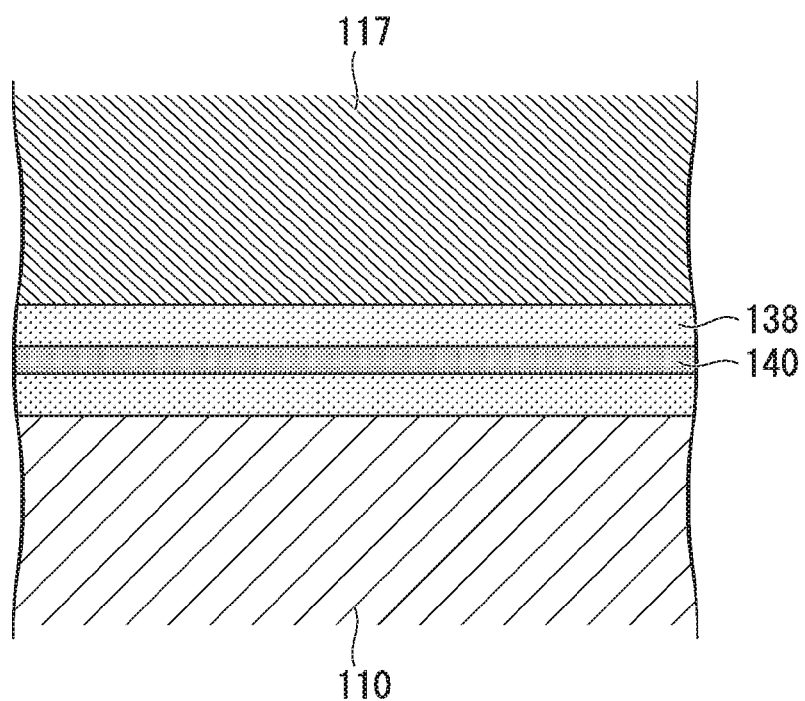
FIG. 7 is an enlarged cross-sectional view illustrating a bonding interface between a heat sink main body and a metal member layer of the heat sink illustrated in FIG. 6.

As illustrated in FIG. 7, a compound layer 138 is formed at a bonding interface between the heat sink main body 110 and the metal member layer 117. The compound layer 138 is formed through mutual diffusion of Al atoms of the heat sink main body 110 and Cu atoms of the metal member layer 117. The compound layer 138 has a concentration gradient in which the concentration of Al atoms further decreases and the concentration of Cu atoms further increases as it goes toward the metal member layer 117 from the heat sink main body 110.

The compound layer 138 is constituted by an intermetallic compound composed of Cu and Al. In this embodiment, the compound layer 138 has a structure in which a plurality of the intermetallic compounds are laminated along the bonding interface. Here, the thickness of the compound layer 138 is set in a range of 1 μm to 80 μm, and preferably in a range of 5 μm to 80 μm.

In addition, in this embodiment, the compound layer 138 has a structure in which three kinds of intermetallic compounds are laminated. In the order from the heat sink main body 110 side toward the metal member layer 117 side, a θ-phase and a $\eta_2$-phase are laminated along the bonding interface between the heat sink main body 110 and the metal member layer 117, and at least one phase among a $\xi_2$-phase, a δ-phase, and a $\gamma_2$-phase is laminated.

In addition, at the bonding interface between the compound layer 138 and the metal member layer 117, oxides are dispersed in a layer shape along the bonding interface. Furthermore, in this embodiment, the oxides are composed of aluminum oxides such as alumina ($Al_2O_3$). Furthermore, the oxides are dispersed at the interface between the compound layer 138 and the metal member layer 117 in a disconnected state, and a region in which the compound layer 138 and the metal member layer 117 are in direct contact with each other also exists. In addition, the oxides may be dispersed at the inside of the θ-phase, the $\eta_2$-phase, or at least one phase among the $\xi_2$-phase, the δ-phase, and the $\gamma_2$-phase in a layer shape.

In addition, as illustrated in FIG. 7, a Mg-concentrated layer 140, in which a concentration of Mg is set to 3 mass % or greater, is formed at the inside of the compound layer 138, and the thickness of the Mg-concentrated layer 140 is set in a range of 1 μm to 30 μm. The concentration of Mg in the Mg-concentrated layer 140 is preferably 5 mass % to 15 mass %, and more preferably 7 mass % to 9 mass %, but there is no limitation to the ranges. The thickness of the Mg-concentrated layer 140 is preferably 3 μm to 25 μm, and more preferably 5 μm to 20 μm, but there is no limitation to the ranges.

Figure 8:
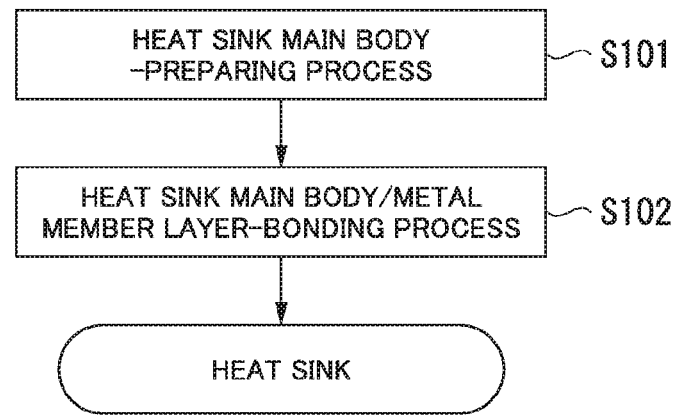
FIG. 8 is a flowchart illustrating a method of manufacturing the heat sink according to the second embodiment.

Next, description will be given of a method of manufacturing the heat sink 101 according to this embodiment with reference to FIG. 8 and FIG. 9.

(Heat Sink Main Body-Preparing Process S101)

First, the heat sink main body 110 to be bonded is prepared. At this time, a concentration of Mg in a region which ranges from the bonding surface with the metal member layer 117 to 50 μm in the depth direction in the heat sink main body 110 is set in a range of 0.3 mass % to 15 mass %.

In this embodiment, as described above, Mg is added to an aluminum alloy that constitutes the heat sink main body 110, and thus the entirety of the heat sink main body 110 contains Mg in a range of 0.3 mass % to 15 mass %. The concentration of Mg in the region which ranges from the bonding surface with the metal member layer 117 in the heat sink main body 110 to 50 μm in the depth direction is preferably 2 mass % to 10.8 mass %, and more preferably 4.9 mass % to 8.3 mass %, but there is no limitation to the ranges.

(Heat Sink Main Body/Metal Member Layer-Bonding Process S102)

Next, as illustrated in FIG. 9, the heat sink main body 110 and the metal plate 127 that becomes the metal member layer 117 are laminated, and the resultant laminated body is disposed in a vacuum heating furnace and is heated therein in a pressurized state (pressure is set to 1 to 35 kgf/cm² (0.10 to 3.43 MPa)) in a laminating direction to subject the metal plate 127 and the heat sink main body 110 to solid-phase diffusion bonding. Furthermore, in respective bonding surfaces, which are subjected to the solid-phase diffusion bonding, of the metal plate 127 and the heat sink main body 110, scratches on the bonding surface are removed in advance and thus the bonding surfaces are made to be smooth. A pressure during the pressurization is preferably set to 8 to 20 kgf/cm² (0.78 to 1.96 MPa), but there is no limitation to this range.

Here, it is preferable that a pressure inside the vacuum heating furnace be set in a range of $10^{-6}$ Pa to $10^{-3}$ Pa, a heating temperature be set in a range of 400° C. to 520° C., and retention time be set in a range of 0.25 hours to 3 hours. It is more preferable that the pressure inside the vacuum heating furnace be set in a range of $10^{-5}$ Pa to $10^{-4}$ Pa, the heating temperature be set in a range of 480° C. to 510° C., and the retention time be set in a range of 0.5 hours to 2 hours. However, there is no limitation to the ranges.

In the heat sink main body/metal member layer-bonding process S102, Cu atoms in the metal plate 127 diffuse to the heat sink main body 110 side, and thus the compound layer 138 is formed as illustrated in FIG. 7, and the Mg-concentrated layer 140 is formed at the inside of the compound layer 138.

In this manner, the heat sink 101 according to this embodiment is manufactured.

According to the heat sink 101 according to this embodiment which is configured as described above, the metal member layer 117 is formed by bonding the metal plate 127 constituted by a rolled plate of oxygen-free copper on one surface side of the heat sink main body 110, and thus it is possible to make heat spread in a plane direction by the metal member layer 117, and thus it is possible to greatly improve heat dissipation characteristics. In addition, it is possible to bond another member and the heat sink 101 by using solder and the like in a satisfactory manner.

In addition, the heat sink main body 110 is constituted by an aluminum alloy in which the concentration of Si is set in a range of 1 mass % to 25 mass %. Specifically, the heat sink main body 110 is constituted by an aluminum alloy that contains Si in a range of 9.6 mass % to 12 mass %, and Mg in a range of 0.3 mass % to 15 mass %. Accordingly, it is possible to construct the heat sink main body 110 with a complicated structure including a flow passage and the like.

In addition, in this embodiment, as illustrated in FIG. 7, the compound layer 138 is formed at the bonding interface between the heat sink main body 110 and the metal member layer 117. In addition, as illustrated in FIG. 7, the Mg-concentrated layer 140 in which the concentration of Mg is set to 3 mass % or greater is formed at the inside of the compound layer 138, and the thickness of the Mg-concentrated layer 140 is set in a range of 1 μm to 30 μm. Accordingly, it is possible to obstruct diffusion migration of a Cu atom of the metal member layer 117 due to the Mg-concentrated layer 140, and thus it is possible to suppress occurrence of a Kirkendall void. As a result, heat resistance in the laminating direction is lowered, and heat dissipation characteristics are excellent.

In addition, the thickness of the Mg-concentrated layer 140 is set to 30 μm or less, and thus diffusion of the Cu atom is not limited more than necessary. As a result, it is possible to reliably subject the heat sink main body 110 and the metal member layer 117 to the solid-phase diffusion bonding.

In addition, in this embodiment, the bonding interface between the metal member layer 117 and the heat sink main body 110 has the same configuration as the bonding interface between the Cu layer 13B and the heat sink 31 in the first embodiment, and thus it is possible to exhibit the same operational effect as in the first embodiment.

Hereinbefore, description has been given of the embodiments of the invention. However, the invention is not limited thereto, and modifications can be appropriately made in a range not departing from the technical spirit of the invention.

For example, in the embodiments, description has been given of a case where the Cu layer formed from copper as the metal layer (Cu layer) or the metal member layer is subjected to bonding. However, a Ni layer formed from nickel or a nickel alloy or a Ag layer formed from silver or a silver alloy may be subjected to the bonding instead of the Cu layer.

In a case of forming the Ni layer instead of the Cu layer, solderability becomes satisfactory, and thus it is possible to improve bonding reliability with another member. In addition, in a case of forming the Ni layer through the solid-phase diffusion bonding, it is not necessary to perform a masking treatment that is performed when forming a Ni plating film through electroless plating and the like, and thus it is possible to reduce the manufacturing cost. In this case, it is preferable that the thickness of the Ni layer be set to 1 μm to 30 μm. In a case where the thickness of the Ni layer is less than 1 μm, there is a concern that the effect of improving the bonding reliability with another member may disappear, and in a case where the thickness is greater than 30 μm, there is a concern that the Ni layer becomes a heat-resistant body and thus it is difficult to efficiently transfer heat. In addition, in a case of forming the Ni layer through the solid-phase diffusion bonding, with regard to solid-phase diffusion bonding between an Al layer and Ni, a bonding temperature is set to 400° C. to 520° C., but the other conditions can be set to the same conditions as in the above-described embodiments.

In a case of forming the Ag layer instead of the Cu layer, for example, when bonding the Ag layer with another member by using a silver oxide paste including silver oxide particles and a reducing agent composed of an organic material, bonding between silver after a silver oxide of the silver oxide paste is reduced by the reducing agent, and the Ag layer is bonded between the same kinds of metals, and thus it is possible to improve the bonding reliability. In addition, the Ag layer having satisfactory heat conductivity is formed, and thus it is possible to efficiently and widely transfer heat in an in-plane direction. In this case, it is preferable that the thickness of the Ag layer be set to 1 μm to 20 μm. In a case where the thickness of the Ag layer is less than 1 μm, there is a concern that the effect of improving the bonding reliability with another member may disappear, and in a case where the thickness is greater than 20 μm, there is a concern that the effect of improving the bonding reliability is not obtained and an increase in the cost is caused. In addition, in a case of forming the Ag layer through the solid-phase diffusion bonding, with regard to the solid-phase diffusion bonding between an Al layer and Ag, a bonding temperature is set to 400° C. to 520° C., but the other conditions can be set to the same conditions as in the above-described embodiments.

Figure 10:
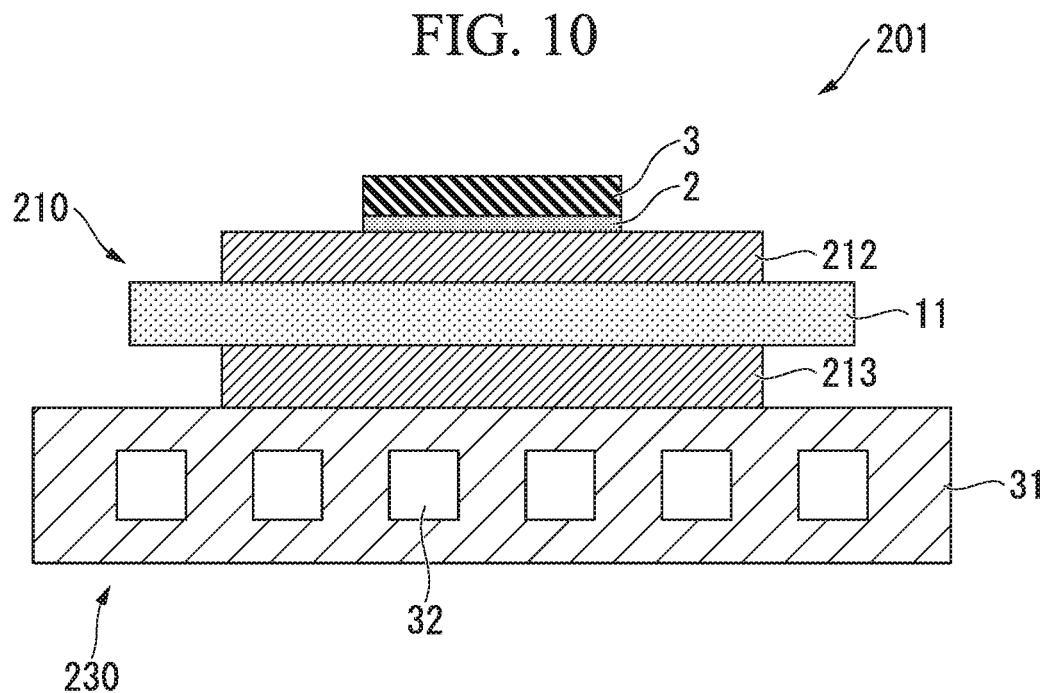
FIG. 10 is a schematic view illustrating a power module including a power module substrate with heat sink according to another embodiment of the invention.

In addition, in the first embodiment, description has been given of a configuration in which the metal layer 13 includes the Al layer 13A and the Cu layer 13B, but there is no limitation thereto. As illustrated in FIG. 10, the entirety of the metal layer may be constituted by copper or a copper alloy. In a power module substrate with heat sink 230 illustrated in FIG. 10, a copper plate is bonded to a surface on the other side (lower side in FIG. 10) of the ceramic substrate 11 in accordance with a DBC method, an active metal brazing method, and the like, and a metal layer 213 formed from copper or a copper alloy is formed. In addition, the metal layer 213 and the heat sink 31 are subjected to the solid-phase diffusion bonding. Furthermore, in the power module substrate 210 illustrated in FIG. 10, a circuit layer 212 is also constituted by copper or a copper alloy. A power module 201 illustrated in FIG. 10 includes the power module substrate with heat sink 230, and a semiconductor element 3 that is bonded to one surface (upper surface in FIG. 10) of the power module substrate with heat sink 230 through a solder layer 2.

In the first embodiment, description has been given of a configuration in which the circuit layer is formed through bonding of an aluminum plate having the purity of 99 mass %, but there is no limitation thereto. The circuit layer may be constituted by other metals such as pure aluminum having the purity of 99.99 mass % or greater, another aluminum or an aluminum alloy, and copper or a copper alloy. In addition, the circuit layer may be set to have a two-layer structure of an Al layer and a Cu layer. This is also true of the power module substrate 210 illustrated in FIG. 10.

In the metal layer/heat sink-bonding process S05 according to the first embodiment, description has been given of a configuration in which the metal layer 13 (Cu layer 13B) and the heat sink 31 are laminated, and the resultant laminated body is disposed in a vacuum heating furnace and is heated therein in a pressurized state in a laminating direction. In addition, in the heat sink main body/metal member layer-bonding process S102 according to the second embodiment, description has been given of a configuration in which the heat sink main body 110 and the metal plate 127 that becomes the metal member layer 117 are laminated, and the resultant laminated body is disposed in a vacuum heating furnace and is heated therein in a pressurized state (pressure of 5 to 35 kgf/cm$^2$) (0.49 to 3.43 M Pa)) in a laminating direction. However, there is no limitation to the above-described configurations, and as illustrated in FIG. 11, an electrical heating method may be applied when subjecting an aluminum alloy member 301 (the heat sink 31 or the heat sink main body 110), and a metal member 302 (the metal layer 13 or the metal member layer 117) to the solid-phase diffusion bonding.

Figure 11:
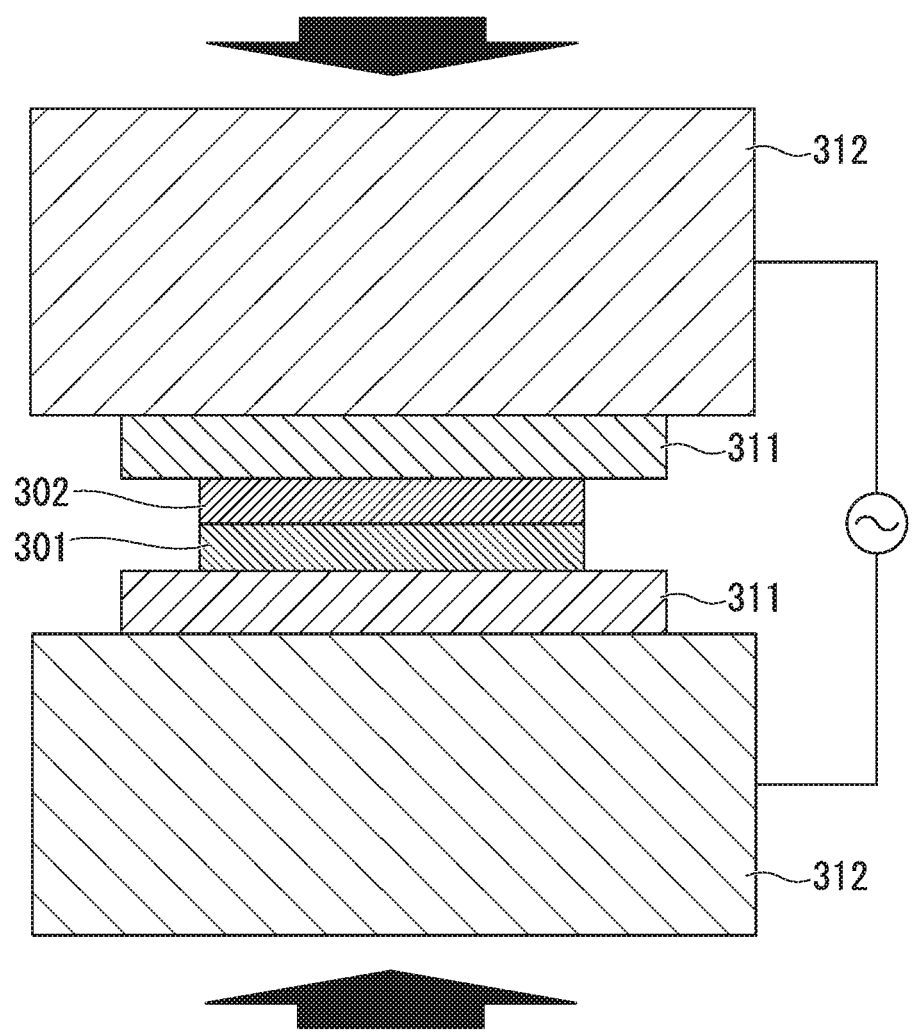
FIG. 11 is a schematic view illustrating a situation in which solid-phase diffusion bonding is performed by an electrical heating method.

In a case of performing the electrical heating, as illustrated in FIG. 11, the aluminum alloy member 301 and the metal member 302 are laminated, and the resultant laminated body is pressurized in a laminating direction by a pair of electrodes 312 and 312 through carbon plates 311 and 311, and electrification is performed with respect to the aluminum alloy member 301 and the metal member 302. In this case, the carbon plates 311 and 311, the aluminum alloy member 301, and the metal member 302 are heated by Joule's heat, and thus the aluminum alloy member 301 and the metal member 302 are subjected to the solid-phase diffusion bonding.

In the above-described electrical heating method, the aluminum alloy member 301 and the metal member 302 are directly electrically heated. Accordingly, for example, it is possible to make a temperature rising rate be as relatively fast as 30 to 100° C./min, and thus it is possible to perform the solid-phase diffusion bonding in a short time. As a result, an influence of oxidation on a bonding surface is small, and thus it is also possible to perform bonding, for example, in an atmospheric atmosphere. In addition, in accordance with a resistance value or specific heat of the aluminum alloy member 301 and the metal member 302, it is possible to bond the aluminum alloy member 301 and the metal member 302 in a state in which a temperature difference occurs therebetween, and thus a difference in thermal expansion decreases. As a result, it is possible to realize a reduction in thermal stress.

Here, in the above-described electrical heating method, it is preferable that a pressurizing load that is applied by the pair of electrodes 312 and 312 be set in a range of 30 kgf/cm$^2$ to 100 kgf/cm$^2$ (2.94 MPa to 9.8 MPa). The pressurizing load is more preferably set in a range of 50 kgf/cm$^2$ to 80 kgf/cm$^2$ (4.90 MPa to 7.85 MPa), but there is no limitation to the ranges.

In addition, in a case of applying the electrical heating method, with regard to surface roughness of the aluminum alloy member 301 and the metal member 302, it is preferable that arithmetic average roughness Ra be set to 0.3 µm to 0.6 µm, and the maximum height Rz be set in a range of 1.3 µm to 2.3 µm. In typical solid-phase diffusion bonding, it is preferable that the surface roughness of the bonding surface be small. However, in a case of the electrical heating method, when the surface roughness of the bonding surface is too small, interface contact resistance decreases, and thus it is difficult to locally heat the bonding interface. Accordingly, the surface roughness is preferably set in the above-described range.

Furthermore, the above-described electrical heating method can be used in the metal layer/heat sink-bonding process S05 according to the first embodiment. In this case, since the ceramic substrate 11 is an insulator, thus it is necessary to short-circuit the carbon plates 311 and 311, for example, with a jig formed from carbon, and the like. Bonding conditions are the same as those in the bonding between the aluminum member 301 and the copper member 302.

In addition, surface roughness of the metal layer 13 (Cu layer 13B) and the heat sink 31 is the same as in the case of the aluminum member 301 and the copper member 302.

EXAMPLES

Hereinafter, description will be given of results of a confirmation experiment that is performed to confirm the effect of the invention.

(Preparation of Test Piece)

One surface of an aluminum alloy plate (50 mm×50 mm, thickness: 5 mm) illustrated in Table 1 was ground until reaching the concentration of Mg in Table 1, and a metal plate (40 mm×40 mm, thickness illustrated in Table 1) illustrated in Table 1 was solid-phase diffusion-bonded to the surface in accordance with the method described in the embodiments.

In Examples 1 to 10, and Comparative Examples 1 to 5, the aluminum plate and the metal plate were pressurized in a laminating direction with a load of 15 kgf/cm$^2$ (1.47 MPa), and the solid-phase diffusion bonding was performed with a vacuum heating furnace under conditions of 500° C. and 180 minutes.

In Examples 11 to 15, the aluminum alloy plate and the metal plate were subjected to the solid-phase diffusion bonding in accordance with the electrical heating method illustrated in FIG. 11. Furthermore, a pressurizing load with the electrodes was set to 15 kgf/cm$^2$ (1.47 MPa), a heating temperature (copper plate temperature) was set to 510° C., retention time at the heating temperature was set to 5 minutes, and a temperature rising rate was set to 80° C./minute. In addition, a bonding atmosphere was set to an atmospheric atmosphere.

(Thickness of Mg-Concentrated Layer)

A cross-section of the bonded body of the aluminum alloy plate and the metal plate, which were subjected to the solid-phase diffusion bonding, was observed to measure the thickness of the Mg-concentrated layer that was formed at the bonding interface as follows. Evaluation results are illustrated in Table 1.

With regard to the thickness of the Mg-concentrated layer, an area of a region in which the concentration of Mg is 3 mass % or greater was measured from a Mg mapping image of the bonding interface between the aluminum alloy plate and the metal plate by EPMA (electron probe microanalyzer), and a thickness was obtained by dividing the area by a dimension of a width of a measurement visual field, and an average of five visual fields was set as the thickness of the Mg-concentrated layer. Furthermore, the measurement was performed at a magnification of 2000 times and in a range of 50 μm in the laminating direction with contact surfaces of the aluminum alloy plate and the metal plate set as a center.

(Heat Cycle Test)

Next, a heat cycle test was performed with respect to the bonded body that was manufactured as described above. The heat cycle for 5 minutes at −40° C. and for 5 minutes at 150° C. was applied to the test piece (power module with heat sink) 4000 times by using a thermal impact tester (TSB-51, manufactured by ESPEC CORP.) in a liquid phase (Fluorinert).

In addition, heat resistance in the laminating direction of the bonded body and a bonding rate thereof before the heat cycle test, and heat resistance in the laminating direction of the bonded body and a bonding rate thereof after the heat cycle test were evaluated as follows.

(Evaluation of Bonding Rate)

The bonding rate of a bonding portion between the aluminum plate and the metal plate of the bonded body was evaluated by using an ultrasonic inspection device, and was calculated from the following expression. Here, an initial bonding area was set as an area to be bonded before bonding, that is, an area of the aluminum plate. Peeling-off in an ultrasonic inspection image is shown as a white portion, and thus an area of the white portion was set as a peeling-off area. Evaluation results are illustrated in Table 1.

Bonding rate (%)={(initial bonding area)−(peeling-off area)}/(initial bonding area)×100

(Measurement of Heat Resistance)

A heater chip (13 mm×10 mm×0.25 mm) was soldered to a surface of the metal plate, and the aluminum alloy plate was brazed to a cooling device. Next, the heater chip was heated at power of 100 W, and a temperature of the heater chip was measured by using a thermocouple. In addition, a temperature of a cooling medium (ethylene glycol:water=9:1), which flows through the cooling device, was measured. In addition, a value obtained by dividing a difference between the temperature of the heater chip and the temperature of the cooling medium by electric power was set as heat resistance.

Furthermore, heat resistance in Comparative Example 1, in which the Mg-concentrated layer was not formed, before the heat cycle test was set to "1" as a reference, and the heat resistance was evaluated as a ratio with Comparative Example 1. Evaluation results are illustrated in Table 1.

TABLE 1

| | Metal plate | | Aluminum alloy plate | | Concentration of Mg in the vicinity of bonding surface (mass %) | Thickness of Mg-concentrated layer (μm) | Bonded body | | | |
|---|---|---|---|---|---|---|---|---|---|---|
| | | | | | | | Initial | | After heat cycle | |
| | Material | Thickness (μm) | Material | Concentration of Si (mass %) | | | Bonding rate (%) | Heat resistance | Bonding rate (%) | Heat resistance |
| Example 1 | Oxygen-free copper | 2000 | ADC6 | 1.0 | 9.3 | 20 | 95.8 | 0.661 | 93.6 | 0.673 |
| Example 2 | Oxygen-free copper | 2000 | AC4B | 7.6 | 4.9 | 10 | 97.9 | 0.933 | 95.6 | 0.952 |
| Example 3 | Oxygen-free copper | 2000 | AC9A | 23.7 | 15 | 30 | 96.1 | 0.869 | 93.2 | 0.886 |
| Example 4 | Oxygen-free copper | 2000 | ADC12 | 11.4 | 0.3 | 1 | 95.9 | 0.987 | 93.7 | 1.004 |
| Example 5 | Oxygen-free copper | 2000 | ADC12 | 11.4 | 7.1 | 7 | 96.7 | 0.980 | 93.8 | 0.998 |
| Example 6 | Oxygen-free copper | 2000 | ADC12 | 11.4 | 8.3 | 10 | 97.1 | 0.972 | 94.2 | 0.988 |
| Example 7 | Oxygen-free copper | 2000 | ADC12 | 11.4 | 10 | 20 | 98.1 | 0.982 | 95.2 | 0.996 |
| Example 8 | Oxygen-free copper | 2000 | ADC12 | 11.4 | 13.5 | 25 | 96.2 | 0.990 | 93.4 | 1.005 |
| Example 9 | Nickel | 10 | ADC12 | 11.4 | 7.4 | 15 | 97.5 | 1.372 | 95.1 | 1.399 |
| Example 10 | Silver | 10 | ADC12 | 11.4 | 10.8 | 20 | 94.1 | 1.370 | 91.8 | 1.392 |
| Example 11 | Oxygen-free copper | 2000 | ADC6 | 1.0 | 9.3 | 15 | 98.4 | 0.653 | 96.0 | 0.664 |
| Example 12 | Oxygen-free copper | 2000 | AC9A | 23.7 | 15 | 25 | 97.6 | 0.860 | 95.6 | 0.873 |
| Example 13 | Oxygen-free copper | 2000 | ADC12 | 11.4 | 13.5 | 21 | 98.5 | 0.976 | 95.7 | 0.990 |
| Example 14 | Nickel | 10 | ADC12 | 11.4 | 7.4 | 13 | 96.0 | 1.353 | 93.3 | 1.377 |
| Example 15 | Silver | 10 | ADC12 | 11.4 | 10.8 | 17 | 97.2 | 1.355 | 94.5 | 1.378 |
| Comparative Example 1 | Oxygen-free copper | 2000 | ADC12 | 11.4 | 0 | None | 95.7 | 1.000 | 88.5 | 1.027 |
| Comparative Example 2 | Oxygen-free copper | 2000 | ADC12 | 11.4 | 30 | 46 | 89.2 | 1.030 | 81.8 | 1.056 |
| Comparative Example 3 | Oxygen-free copper | 2000 | ADC12 | 11.4 | 0.1 | 0.2 | 97.1 | 1.040 | 88.4 | 1.068 |
| Comparative Example 4 | Nickel | 10 | ADC12 | 11.4 | 0 | None | 97.6 | 1.444 | 89.3 | 1.483 |
| Comparative Example 5 | Silver | 10 | ADC12 | 11.4 | 0 | None | 96.6 | 1.428 | 89.6 | 1.471 |

In Comparative Example 1 in which the Mg-concentrated layer was not formed, it was confirmed that the heat resistance further increases in comparison to the examples. In addition, when comparing Comparative Example 4 in which nickel was used as the metal plate and Examples 9 and 14, it was confirmed that the heat resistance of Comparative Example 4 further increases. Similarly, when comparing Comparative Example 5 in which silver was used as the metal plate and Examples 10 and 15, it was confirmed that the heat resistance of Comparative Example 5 further increases. This is assumed to be because a Kirkendall void was formed.

In addition, in Comparative Example 2 in which the thickness of the Mg-concentrated layer was greater than the upper limit of the invention, the bonding rate was low and the heat resistance was great. This is assumed to be because the Mg-concentrated layer was formed in a large thickness, and diffusion of a metal element of the metal plate was suppressed.

In addition, in Comparative Example 3 in which the thickness of the Mg-concentrated layer was smaller than the lower limit of the invention, as is the case with Comparative Example 1, it was confirmed that the resistance increased. This is assumed to be because it was difficult to sufficiently suppress occurrence of the Kirkendall void.

In contrast, in the examples in which the thickness of the Mg-concentrated layer was set in the range of the invention, it was confirmed that the heat resistance was smaller and the bonding rate was sufficiently higher in comparison to the comparative examples. This is assumed to be because the Mg-concentrated layer was formed in an appropriate thickness, and thus diffusion of a metal element that constitutes the metal plate was suppressed, and occurrence of the Kirkendall void was suppressed.

In addition, in Examples 11 to 15 to which the electrical heating method was applied, even when the bonding was performed in the atmosphere, the aluminum alloy plate and the metal plate were bonded in a satisfactory manner.

In addition, it was confirmed that a bonded body, in which an increase in the heat resistance or a decrease in the bonding rate after the heat cycle test is rarely exhibited and bonding reliability is high, was obtained.

From the above-described results, according to the invention, it was confirmed that the aluminum alloy member formed from an aluminum alloy that contains a relatively large amount of Si, and the metal member formed from copper, nickel, or silver are bonded in a satisfactory manner, and thus it is possible to obtain a bonded body in which heat resistance in a laminating direction is low.

INDUSTRIAL APPLICABILITY

According to the invention, it is possible to provide a bonded body in which an aluminum alloy member formed from an aluminum alloy that contains a relatively large amount of Si, and a metal member formed from copper, nickel, or silver are bonded to each other in a satisfactory manner, and heat resistance in a laminating direction is low, a power module substrate with heat sink and a heat sink which include the bonded body, a method of manufacturing a bonded body, and a method of manufacturing a power module substrate with heat sink, and a method of manufacturing a heat sink.

REFERENCE SIGNS LIST 10, 210: Power module substrate
11: Ceramic substrate
13, 213: Metal layer
13B: Cu layer (metal member)
31: Heat sink (aluminum alloy member)
40: Mg-concentrated layer
101: Heat sink
110: Heat sink main body (aluminum alloy member)
117: Metal member layer
140: Mg-concentrated layer

The invention claimed is:

1. A method of manufacturing a bonded body in which an aluminum alloy member formed from an aluminum alloy, and a metal member formed from copper, nickel, or silver are bonded to each other,
wherein the aluminum alloy member is constituted by an aluminum alloy in which a concentration of Si is in a range of 1 mass % to 25 mass %,
in the aluminum alloy member before bonding, a concentration of Mg at least in a region which ranges from a bonding surface with the metal member to 50 μm in a depth direction is in a range of 0.3 mass % to 15 mass %, and
the aluminum alloy member and the metal member are subjected to solid-phase diffusion bonding.

2. The method of manufacturing a bonded body according to claim 1,
wherein the aluminum alloy member and the metal member are laminated, and are electrically heated while being pressurized in a laminating direction to subject the aluminum alloy member and the metal member to the solid-phase diffusion bonding.

3. A method of manufacturing a power module substrate with heat sink which includes an insulating layer, a circuit layer that is formed on one surface of the insulating layer, a metal layer that is formed on the other surface of the insulating layer, and a heat sink that is disposed on a surface, which is opposite to the insulating layer, of the metal layer,
wherein in the metal layer, a bonding surface with the heat sink is constituted by copper, nickel, or silver,
in the heat sink, a bonding surface with the metal layer is constituted by an aluminum alloy in which a concentration of Si is in a range of 1 mass % to 25 mass %,
in the heat sink before bonding, a concentration of Mg at least in a region which ranges from a bonding surface with the metal layer to 50 μm in a depth direction is in a range of 0.3 mass % to 15 mass %, and
the heat sink and the metal layer are subjected to solid-phase diffusion bonding.

4. The method of manufacturing a power module substrate with heat sink according to claim 3,
wherein the heat sink and the metal layer are laminated, and are electrically heated while being pressurized in a laminating direction to subject the heat sink and the metal layer to the solid-phase diffusion bonding.

5. A method of manufacturing a heat sink including a heat sink main body and a metal member layer that is bonded to the heat sink main body,
wherein the metal member layer is formed from copper, nickel, or silver,
the heat sink main body is constituted by an aluminum alloy in which a concentration of Si is in a range of 1 mass % to 25 mass %,
in the heat sink main body before bonding, a concentration of Mg at least in a region which ranges from a bonding surface with the metal member layer to 50 μm in a depth direction is in a range of 0.3 mass % to 15 mass %, and
the heat sink main body and the metal member layer are subjected to solid-phase diffusion bonding.

6. The method of manufacturing a heat sink according to claim 5,
   wherein the heat sink main body and the metal member layer are laminated, and are electrically heated while being pressurized in a laminating direction to subject the heat sink main body and the metal member layer to the solid-phase diffusion bonding.

* * * * *